US012244286B2

(12) United States Patent
Hasegawa et al.

(10) Patent No.: US 12,244,286 B2
(45) Date of Patent: Mar. 4, 2025

(54) IMPEDANCE MATCHING DEVICE AND HIGH-FREQUENCY POWER SUPPLY SYSTEM

(71) Applicant: DAIHEN CORPORATION, Osaka (JP)

(72) Inventors: Yuichi Hasegawa, Osaka (JP); Yuya Ueno, Osaka (JP)

(73) Assignee: DAIHEN CORPORATION, Osaka (JP)

( * ) Notice: Subject to any disclaimer, the term of this patent is extended or adjusted under 35 U.S.C. 154(b) by 172 days.

(21) Appl. No.: 17/903,467

(22) Filed: Sep. 6, 2022

(65) Prior Publication Data

US 2023/0097183 A1 Mar. 30, 2023

(30) Foreign Application Priority Data

Sep. 29, 2021 (JP) ................................ 2021-159088

(51) Int. Cl.
*H03H 7/40* (2006.01)
*H01J 37/32* (2006.01)
*H03H 7/38* (2006.01)

(52) U.S. Cl.
CPC ......... *H03H 7/40* (2013.01); *H01J 37/32183* (2013.01)

(58) Field of Classification Search
CPC ........... H03H 7/38; H03H 7/40; H03H 7/383; H03H 11/28; H03H 11/30; H03H 2007/386; H03H 9/0004
USPC ......................................................... 333/17.3
See application file for complete search history.

(56) References Cited

U.S. PATENT DOCUMENTS 9,030,101 B2 5/2015 Valcore, Jr. et al.
9,114,666 B2 8/2015 Valcore, Jr. et al.
9,171,699 B2 10/2015 Valcore, Jr. et al.
9,197,196 B2 11/2015 Valcore, Jr. et al.
9,236,228 B2 1/2016 Valcore, Jr. et al.
9,295,148 B2 3/2016 Fong et al.
9,320,126 B2 4/2016 Valcore, Jr. et al.
9,337,000 B2 5/2016 Marakhtanov et al.
9,368,329 B2 6/2016 Valcore, Jr. et al.
(Continued)

FOREIGN PATENT DOCUMENTS

JP 2017-188434 A 10/2017
WO WO 2020/131180 A1 6/2020

*Primary Examiner* — Hai L Nguyen
(74) *Attorney, Agent, or Firm* — Crowell & Moring LLP

(57) ABSTRACT

The present disclosure, calculating an impedance change considering a reflected wave due to IMD, provides an impedance matching device for performing impedance matching between a source power supply side and a load side, including: a detector that detects a forward wave power supplied from the source power supply and a reflected wave power from the load and outputs a forward wave voltage as a component of the forward wave power and a reflected wave voltage as a component of the reflected wave power, an impedance information output part that calculates impedance from the forward wave voltage and the reflected wave voltage, and a matching part that performs matching operation based on an impedance value supplied from the impedance information output part. The impedance information output part complexifies each of the forward wave voltage and the reflected wave voltage to calculate an impedance value to generate an impedance locus.

8 Claims, 4 Drawing Sheets

(56) References Cited

U.S. PATENT DOCUMENTS

| | | | | |
|---|---|---|---|---|
| 9,390,893 | B2 | 7/2016 | Valcore, Jr. et al. | |
| 9,401,264 | B2 | 7/2016 | Marakhtanov et al. | |
| 9,462,672 | B2 | 10/2016 | Valcore, Jr. et al. | |
| 9,502,216 | B2 | 11/2016 | Valcore, Jr. et al. | |
| 9,530,620 | B2 | 12/2016 | Valcore, Jr. | |
| 9,607,810 | B2 | 3/2017 | Valcore, Jr. et al. | |
| 9,620,334 | B2 | 4/2017 | Lyndaker et al. | |
| 9,620,337 | B2 | 4/2017 | Valcore, Jr. et al. | |
| 9,711,332 | B2 | 7/2017 | Howald et al. | |
| 9,720,022 | B2 | 8/2017 | Howald et al. | |
| 9,779,196 | B2 | 10/2017 | Valcore, Jr. et al. | |
| 9,812,294 | B2 | 11/2017 | Valcore, Jr. et al. | |
| 9,831,065 | B2 | 11/2017 | Fong et al. | |
| 9,831,071 | B2 | 11/2017 | Howald et al. | |
| 9,837,252 | B2 | 12/2017 | Howald et al. | |
| 9,842,725 | B2 | 12/2017 | Valcore, Jr. et al. | |
| 9,960,015 | B2 | 5/2018 | Valcore, Jr. et al. | |
| 9,997,333 | B2 | 6/2018 | Valcore, Jr. et al. | |
| 11,756,768 | B2 * | 9/2023 | Hasegawa ......... | H01J 37/32183 315/111.21 |
| 11,990,317 | B2 * | 5/2024 | Hasegawa ......... | H01J 37/32183 |
| 2014/0305589 | A1 | 10/2014 | Valcore, Jr. | |
| 2015/0069912 | A1 | 3/2015 | Valcore, Jr. et al. | |
| 2015/0311041 | A1 | 10/2015 | Valcore, Jr. et al. | |
| 2016/0044775 | A1 | 2/2016 | Valcore, Jr. et al. | |
| 2016/0189937 | A1 | 6/2016 | Valcore, Jr. et al. | |
| 2016/0233058 | A1 | 8/2016 | Marakhtanov et al. | |
| 2016/0259872 | A1 | 9/2016 | Howald et al. | |
| 2016/0268100 | A1 | 9/2016 | Valcore, Jr. et al. | |
| 2016/0307736 | A1 | 10/2016 | Howald et al. | |
| 2016/0307738 | A1 | 10/2016 | Marakhtanov et al. | |
| 2016/0308560 | A1 | 10/2016 | Howald et al. | |
| 2016/0336152 | A1 | 11/2016 | Valcore, Jr. et al. | |
| 2017/0032945 | A1 | 2/2017 | Valcore, Jr. et al. | |
| 2017/0084432 | A1 | 3/2017 | Valcore, Jr. et al. | |
| 2017/0178873 | A1 | 6/2017 | Valcore, Jr. et al. | |
| 2017/0194130 | A1 | 7/2017 | Lyndaker et al. | |
| 2017/0294293 | A1 | 10/2017 | Howald et al. | |
| 2017/0330732 | A1 | 11/2017 | Valcore, Jr. et al. | |
| 2018/0018418 | A1 | 1/2018 | Valcore, Jr. et al. | |
| 2018/0053632 | A1 | 2/2018 | Fong et al. | |
| 2018/0068834 | A1 | 3/2018 | Valcore, Jr. et al. | |
| 2018/0294140 | A1 | 10/2018 | Valcore, Jr. et al. | |
| 2018/0323038 | A1 | 11/2018 | Valcore, Jr. et al. | |
| 2019/0057847 | A1 | 2/2019 | Valcore, Jr. et al. | |
| 2019/0272306 | A1 | 9/2019 | Howald et al. | |
| 2019/0318919 | A1 | 10/2019 | Lyndaker et al. | |
| 2020/0067545 | A1 | 2/2020 | Howald et al. | |
| 2020/0074034 | A1 | 3/2020 | Valcore, Jr. et al. | |
| 2020/0218774 | A1 | 7/2020 | Howald et al. | |
| 2020/0243304 | A1 | 7/2020 | Valcore, Jr. et al. | |

* cited by examiner

IMPEDANCE MATCHING DEVICE AND HIGH-FREQUENCY POWER SUPPLY SYSTEM

RELATED APPLICATIONS

This application claims priority to Japanese Patent Application No. 2021-159088, filed on Sep. 29, 2021, the entire content of which is incorporated herein by reference.

BACKGROUND OF THE INVENTION

1. Field of the Invention

The present invention relates to an impedance matching device and a high-frequency power supply system.

2. Description of the Related Art

In the field of semiconductor manufacturing, as electronic equipment has become smaller and more functional, there is a need for higher-density mounting. Connections of elements to a mounting substrate have become miniaturized, and mounting needs to be performed with ever higher reliability.

One of the ways in which mounting reliability can be ensured is by surface modification using plasma. For example, when a substrate to be processed is subjected to plasma processing, it is possible to remove contamination due to organic matter attached to the surface of the substrate, to increase the bonding strength of wire bonding, to improve wettability, and to improve adhesion between the substrate and sealing resin. In order to perform such plasma processing, a power supply device needs to be connected to a plasma reactor device serving as a load.

In the plasma processing, a method is used in which a plurality of power supplies outputs high-frequency powers at different fundamental frequencies (i.e., the frequencies of the fundamentals) to a load. For example, a first power supply outputs a first high-frequency voltage having a first fundamental frequency (for example, 40.68 MHz) so as to supply a first high-frequency power to the load, and a second power supply outputs a second high-frequency voltage having a second fundamental frequency (for example, 400 kHz) (first fundamental frequency>second fundamental frequency) so as to supply a second high-frequency power to the load. This causes a phenomenon in which inter-modulation distortion (hereinafter referred to as IMD) is generated in the output on the first power supply side whose fundamental frequency is higher, and a reflected wave power fluctuates with a period of the second fundamental frequency.

SUMMARY OF THE INVENTION

Conventional matching devices compute impedance at only the first fundamental frequency through a bandpass filter from a detector and perform matching operation while removing IMD components. Thus, when power contains IMD components, the conventional matching devices cannot efficiently supply power to the load (for example, the plasma reactor device) due to the reflected wave power generated at the second fundamental frequency. Then, as described in WO 2020/131180 A and JP 2017-188434 A, there is proposed a method for reducing reflected wave power by controlling a power supply frequency on the high-frequency side. When such frequency control is performed, it is necessary to use a means of being able to sequentially compute impedance on the high-frequency side where the frequency fluctuates at the second fundamental frequency.

In view of the above circumstances, the present disclosure provides techniques for sequentially calculating an impedance change (locus) considering a reflected wave due to IMD.

In view of the foregoing, the present disclosure provides an impedance matching device configured to be disposed between a first power supply and a load and perform impedance matching between the first power supply side and the load side, the first power supply outputting a first high-frequency voltage having a first fundamental frequency so as to supply a first high-frequency power to the load. The impedance matching device includes: a detector that acquires information about the first high-frequency power; an impedance information output part that calculates an impedance value based on the information acquired by the detector; and a matching part that performs matching operation based on an impedance value supplied from the impedance information output part. The impedance information output part generates an impedance locus using the impedance value.

Further features relating to the present disclosure will become apparent from the following descriptions and the attached drawings. Aspects of the present disclosure may be achieved or implemented by various elements and various combinations of such elements as disclosed in the following detailed descriptions and the claims that follow.

It should be understood that the descriptions that follow are for exemplary purposes only, and do not in any way represent a limitation of the scope of the claims or application examples.

According to the techniques of the present disclosure, it is possible to calculate an impedance change (locus) considering a reflected wave due to IMD.

DETAILED DESCRIPTION OF THE PREFERRED EMBODIMENTS

In the following, an embodiment of the present disclosure will be described with reference to the attached drawings. In the attached drawings, functionally identical elements may be designated with identical numerals. The attached drawings illustrate concrete embodiments and implementation examples in accordance with the principles of the present disclosure. However, these are provided to assist an understanding of the present disclosure and should not be construed as limiting the present disclosure.

While the embodiment is described in sufficient detail to enable those skilled in the art to practice the present disclosure, it should be understood that other implementations or embodiments are also possible, and that various changes to configurations or structures and various substitutions of elements may be made without departing from the scope and spirit of the technical concepts of the present disclosure. Accordingly, the following descriptions are not to be interpreted in a limiting sense.

Furthermore, the embodiment of the present disclosure may be implemented using software running on a general-purpose computer, or may be implemented using dedicated hardware or in a combination of software and hardware.

<Configuration Example of Power Supply System 1>

Figure 1:
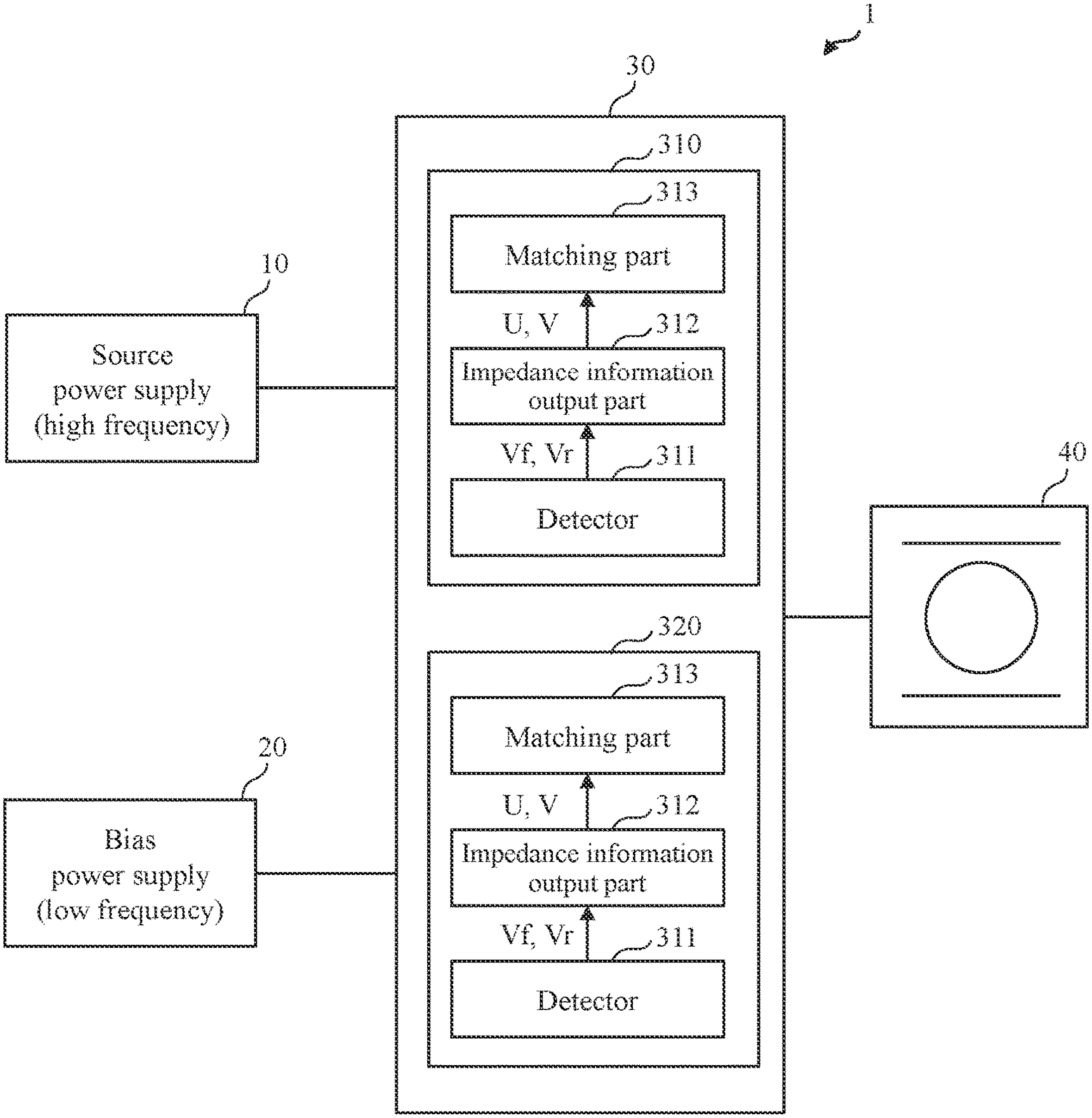
FIG. 1 illustrates a state in which a plasma load 40 is connected to a power supply system (also referred to as a high-frequency power supply system) 1 according to an embodiment.

FIG. 1 illustrates a state in which a plasma load 40 is connected to a power supply system (also referred to as a high-frequency power supply system) 1 according to the present embodiment. The power supply system 1 includes a source power supply 10 (first power supply) that outputs a first high-frequency voltage having a first fundamental frequency so as to supply a first high-frequency power to a load, a bias power supply 20 (second power supply) that outputs a second high-frequency voltage having a second fundamental frequency lower than the first fundamental frequency so as to supply a second high-frequency power to the load, and a matching device (also referred to as an impedance converter) 30 that receives an output from each of the source power supply 10 and the bias power supply 20 and provides impedance matching between the side of the source power supply 10 and the bias power supply 20 and the side of the plasma load 40. The power supply system 1 supplies to the plasma load 40 a forward wave (source power) output from the source power supply 10 and a forward wave (bias power) output from the bias power supply 20 in a superimposed manner, for example.

In the present embodiment, description will be given assuming that the fundamental frequency (i.e., the frequency of the fundamental) (also referred to as an output frequency) of the high-frequency voltage from the source power supply 10 is 40.68 MHz and the fundamental frequency of the high-frequency voltage from the bias power supply 20 is 400 kHz. However, the fundamental frequency of the source power supply 10 is not limited to 40.68 MHz and may be, for example, a frequency in an industrial radio frequency (RF) band, such as 13.56 MHz, 27.12 MHz, or the like. In addition, the fundamental frequency of the bias power supply 20 is not limited to 400 kHz and may be other frequencies.

The fundamental frequency of the source power supply 10 is an HF frequency and the fundamental frequency of the bias power supply 20 is an LF frequency. The fundamental period (i.e., the period of the fundamental: 1/fundamental frequency) of the source power supply 10 is an HF period and the fundamental period (1/fundamental frequency) of the bias power supply 20 is an LF period.

The matching device 30 includes a first matching device 310 provided for the source power supply 10 and a second matching device 320 provided for the bias power supply 20. The first matching device 310 is disposed between the source power supply 10 and the plasma load 40 and performs impedance matching between the source power supply 10 side and the plasma load 40 side. The second matching device 320 is disposed between the bias power supply 20 and the plasma load 40 and performs impedance matching between the bias power supply 20 side and the plasma load 40 side.

The first matching device 310 includes a detector 311, which detects a forward wave (power) Pf and a reflected wave (power) Pr and outputs a forward wave voltage (component) Vf and a reflected wave voltage (component) Vr, an impedance information output part 312, which acquires the forward wave voltage (component) Vf and the reflected wave voltage (component) Vr from the detector 311 and calculates an impedance value, then generates and outputs an impedance locus, and outputs the calculated impedance value, and a matching part 313, which acquires the impedance value from the impedance information output part 312 and performs impedance matching between the source power supply 10 side and the plasma load 40 side.

The second matching device 320 includes a detector 311, an impedance information output part 312, and a matching part 313. Description of the configurations of these components will be omitted since they are identical to those of the first matching device 310, though the corresponding frequency or the like is different.

<Internal Configuration Example of Impedance Information Output Part 312>

Figure 2:
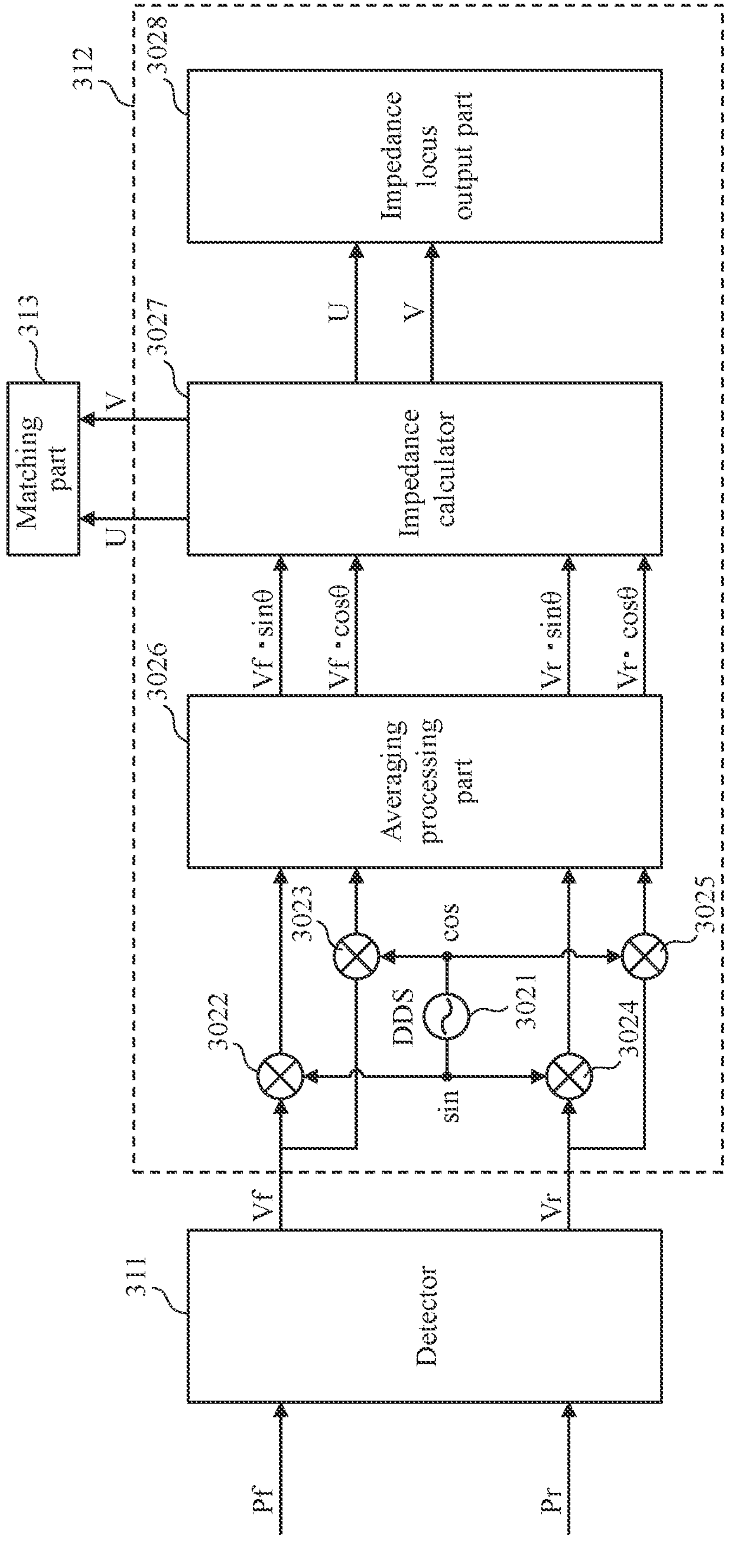
FIG. 2 illustrates an internal configuration example of an impedance information output part 312 of the present embodiment.

FIG. 2 illustrates an internal configuration example of the impedance information output part 312 of the present embodiment. The impedance information output part 312 includes a DDS (direct digital synthesizer) 3021 that generates (oscillates) and outputs a signal (cos component and sin component) at the fundamental frequency f (for example, 40.68 MHz) of the source power supply 10 (HF power supply), multipliers 3022 to 3025, an averaging processing part 3026, an impedance calculator 3027, and an impedance locus output part 3028.

The multiplier 3022 multiplies the forward wave voltage Vf from the detector 311 by an oscillation output ($\cos(2\pi f \cdot ts \cdot k)$) of the DDS 3021 and the multiplier 3023 multiplies the forward wave voltage Vf from the detector 311 by an oscillation output ($\sin(2\pi f \cdot ts \cdot k)$) of the DDS 3021. The multiplier 3024 multiplies the reflected wave voltage Vr from the detector 311 by an oscillation output ($\cos(2\pi f \cdot ts \cdot k)$) of the DDS 3021 and the multiplier 3025 multiplies the reflected wave voltage Vr from the detector 311 by an oscillation output ($\sin(2\pi f \cdot ts \cdot k)$) of the DDS 3021. Detection values (the forward wave voltage Vf and the reflected wave voltage Vr) of the detector 311 are complexified by the DDS 3021 and the multipliers 3022 to 3025. Herein, f (Hz) denotes the HF frequency, is denotes the sample period (i.e., the operating period of the DDS 3021 on the source power supply 10 side), and k denotes the number of samples.

The averaging processing part 3026 averages each of the complexified values of forward wave voltage and reflected wave voltage by the period of the fundamental frequency f of the source power supply 10 and outputs averaged outputs $Vf \cdot \sin\theta$, $Vf \cdot \cos\theta$, $Vr \cdot \sin\theta$, and $Vr \cdot \cos\theta$, where $\theta = 2\pi f \cdot ts \cdot k$.

The impedance calculator 3027 calculates impedance from the averaged outputs $Vf \cdot \sin\theta$, $Vf \cdot \cos\theta$, $Vr \cdot \sin\theta$, and $Vr \cdot \cos\theta$, converts the calculated impedance into a reflection coefficient (vector components U, V) and then supplies the reflection coefficient to each of the matching part 313 and the impedance locus output part 3028. More specifically, the impedance calculator 3027 obtains Vf from $Vf \cdot \sin\theta$ and $Vf \cdot \cos\theta$, obtains Vr from $Vr \cdot \sin\theta$ and $Vr \cdot \cos\theta$, and calculates an impedance value from Vr/Vf.

The impedance locus output part 3028 obtains and outputs an impedance locus on the basis of the reflection coefficient (vector components U, V) acquired from the impedance calculator 3027. The impedance locus output from the impedance locus output part 3028 is displayed on a display screen of a management computer (not shown), for example.

<Process in Impedance Information Output Part 312>

Figure 3:
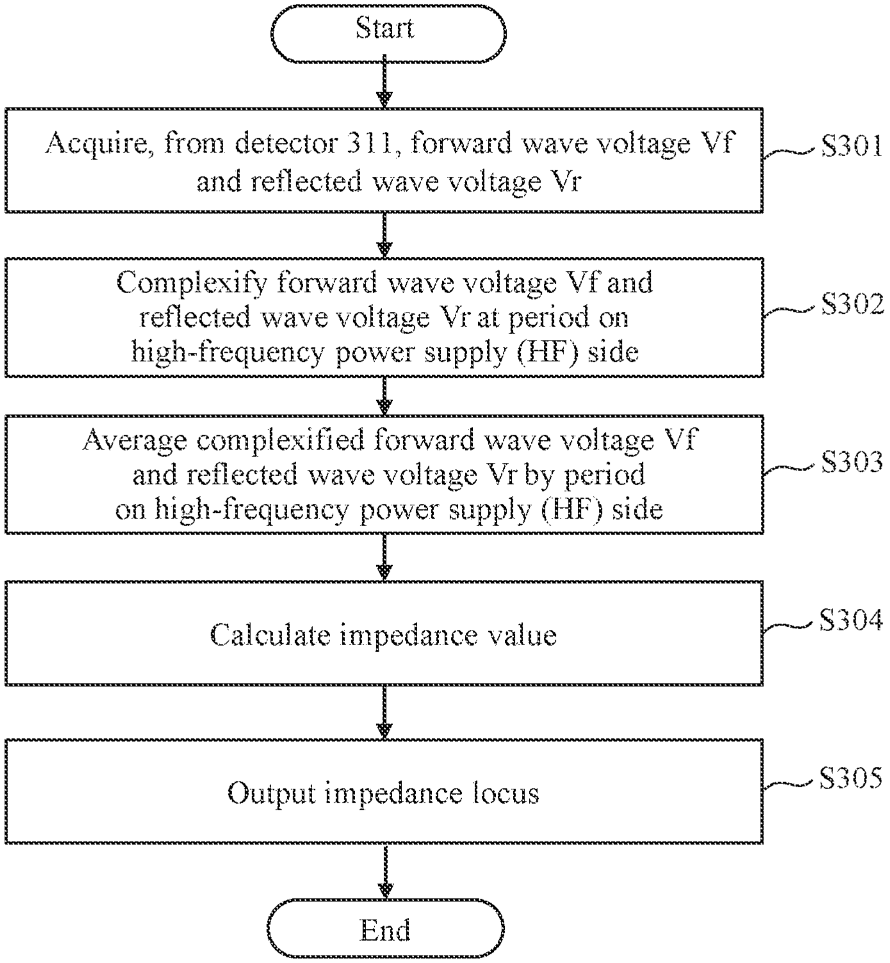
FIG. 3 is a flowchart for illustrating the operation of the impedance information output part 312 (a process from acquiring a forward wave voltage Vf and a reflected wave voltage Vr to outputting an impedance locus)

FIG. 3 is a flowchart for illustrating the operation of the impedance information output part 312 (a process from acquiring a forward wave voltage Vf and a reflected wave voltage Vr to outputting an impedance locus).

(i) Step 301

Figure 4:
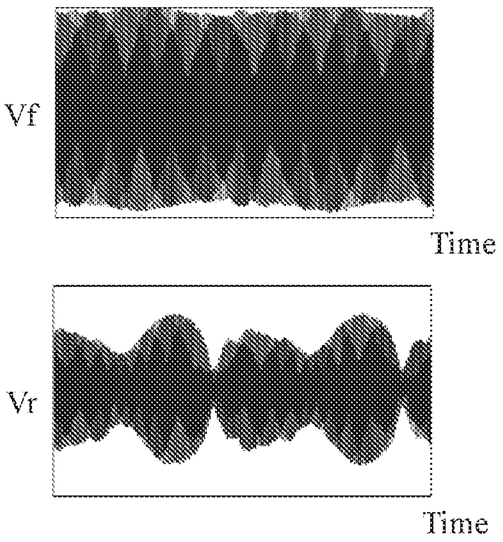
FIG. 4 illustrates waveforms (examples) of the forward wave voltage Vf and the reflected wave voltage Vr output from a detector 311.

The impedance information output part 312 acquires, from the detector 311, a voltage component Vf (forward wave voltage) of a forward wave power Pf and a voltage component Vr (reflected wave voltage) of a reflected wave power Pr. For example, the forward wave voltage Vf and the reflected wave voltage Vr, which the impedance information output part 312 receives from the detector 311, have waveforms as illustrated in FIG. 4.

(ii) Step 302

The impedance information output part 312 generates (oscillates) and outputs a signal (cos component and sin component) at an HF frequency f (for example, 40.68 MHz) using the DDS 3021. Then, the multiplier 3022 multiplies the forward wave voltage Vf from the detector 311 by an oscillation output ($\cos(2\pi f \cdot ts \cdot k)$) of the DDS 3021 and the multiplier 3023 multiplies the forward wave voltage Vf from the detector 311 by an oscillation output ($\sin(2\pi f \cdot ts \cdot k)$) of the DDS 3021. The multiplier 3024 multiplies the reflected wave voltage Vr from the detector 311 by an oscillation output ($\cos(2\pi f \cdot ts \cdot k)$) of the DDS 3021 and the multiplier 3025 multiplies the reflected wave voltage Vr from the detector 311 by an oscillation output ($\sin(2\pi f \cdot ts \cdot k)$) of the DDS 3021. Detection values (the forward wave voltage Vf and the reflected wave voltage Vr) of the detector 311 are complexified by the DDS 3021 and multipliers 3022 to 3025. This means that the DDS 3021 and the multipliers 3022 to 3025 constitute a complex filter. Vf and Vr are transformed into $Vf = Vf\{\cos(2\pi f \cdot ts \cdot k) - j \cdot \sin(2\pi f \cdot ts \cdot k)\}$, $Vr = Vr\{\cos(2\pi f \cdot ts \cdot k) - j \cdot \sin(2\pi f \cdot ts \cdot k)\}$, respectively, by the complex filter.

(iii) Step 303

The averaging processing part 3026 of the impedance information output part 312 acquires complexified forward wave voltage and reflected wave voltage as outputs from the multipliers 3022 to 3025 and then averages each of them by the HF period. Specifically, the averaging processing part 3026 averages each of the complexified Vf and Vr by the HF period in each DDS operating period (1/DDS operation frequency (for example, 100 MHz)).

(iv) Step 304

The impedance calculator 3027 of the impedance information output part 312 calculates an impedance value using the averaged forward wave voltage ($Vf \cdot \cos\theta$ and $Vf \cdot \sin\theta$) and the averaged reflected wave voltage ($Vr \cdot \cos\theta$ and $Vr \cdot \sin\theta$). Specifically, the impedance calculator 3027 obtains a reflection coefficient vector (Vr/Vf) using the voltage values obtained through averaging by the HF period in the averaging processing part 3026. This means that an impedance value in each HF period has been calculated through such operation.

(v) Step 305

The impedance locus output part 3028 of the impedance information output part 312 acquires and outputs vectors (vectors (U, V)) of a reflection coefficient obtained by dividing the LF period (1/400 kHz) by the HF period (1/40.68 MHz). Specifically, the impedance locus output part 3028 acquires a reflection coefficient (vector) corresponding to ((1/400 kHz)÷(1/40.68 MHz)), then generates and outputs an impedance locus in a single time period of the LF frequency.

<Impedance Locus>

Figure 5:
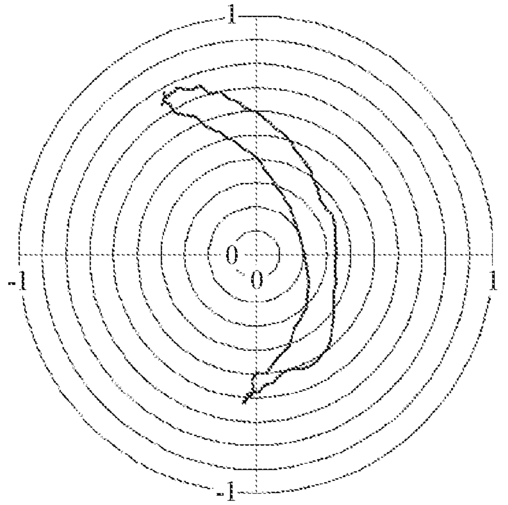
FIG. 5 illustrates an example of an impedance locus.

FIG. 5 illustrates an impedance locus for one cycle of the LF period when matching is achieved by a conventional detection method (detection at only the fundamental). As a matched state (reflection coefficient (u, v)=(0, 0)) is established, the impedance obtained by the conventional detection method is around the center of the Smith chart. However, extension of the impedance locus is up to the point around an absolute value of 0.8 of the reflection coefficient, and a reflected power is generated.

In addition, nearly a matched state (reflection coefficient (u, v)=(0, 0)) is established by vector-averaging various data (reflection coefficient (u, v)) on the impedance locus for one cycle of the LF period. Thus, average impedance equal to that obtained by the conventional detection method can be obtained.

<Impedance During Frequency Control>

The conventional detection method uses a narrow-band bandpass filter for detection, and thus cannot compute correct impedance when frequency control is performed. A method that calculates an impedance locus does not use a bandpass filter, and thus can obtain an impedance locus at a frequency other than the fundamental frequency if it is within a certain range. Furthermore, vector-averaging the impedance locus can obtain average impedance during frequency control.

As described above, generating and outputting (presenting) an impedance locus allows an operator (user) to use the impedance locus for impedance matching when performing frequency control.

<Conclusion>

(i) According to the present embodiment, the impedance information output part 312 of the matching device 30 (first matching device 310) complexifies each of the forward wave voltage and the reflected wave voltage and calculates an impedance value, and then generates an impedance locus using the calculated impedance value. Specifically, the impedance calculator 3027 averages each of the complexified forward wave voltage and reflected wave voltage by the HF period (i.e., the fundamental period of the source power supply 10) and calculates an impedance value using the averaged, complexified forward wave voltage and reflected wave voltage. Then, the impedance locus output part 3028 acquires a reflection coefficient vector for the calculated impedance value corresponding to LF period (1/400 kHz)÷HF period (1/40.68 MHz), and thus can generate an impedance locus in a single time period of the LF frequency.

Accordingly, it is possible to obtain a change in impedance (i.e., impedance locus) considering IMD (reflected wave component). The operator can use such an impedance locus in impedance matching when performing frequency control.

The impedance information output part 312 of the present embodiment, regardless of whether the forward wave power is under frequency control, generates and outputs an impedance locus considering IMD. However, when the forward wave power is under frequency control in the high-frequency power supply (source power supply 10), the impedance information output part 312 calculates impedance from the reflected wave voltage corresponding to the voltage components (a forward wave voltage and a reflected wave voltage) of the power under frequency control. By acquiring and comparing impedance loci before and after the frequency control, it is possible to determine whether impedance matching is optimally performed and to confirm the effect of frequency control.

(ii) The functions of the present embodiment may also be implemented by software program code. In this case, a storage medium with the program code recorded thereon may be provided to a system or device, and a computer (or CPU or MPU) of the system or device may read the program code stored on the storage medium. In this case, the program code per se that has been read from the storage medium will provide the functions of the embodiment described above, and the program code per se and the storage medium having the same stored thereon will constitute the present disclosure. Exemplary storage media for supplying such program code include a flexible disc, a CD-ROM, a DVD-ROM, a hard disk, an optical disk, a magneto-optical disk, a CD-R, magnetic tape, a nonvolatile memory card, and a ROM.

Also, an operating system (OS) or the like running on a computer may perform some or all of actual processes based on an instruction of the program code, and the functions of the embodiment described above may be implemented by the processes. Further, after the program code read from the storage medium has been written to a memory on a computer, a CPU or the like of the computer may perform some or all of actual processes based on an instruction of the program code, and the functions of the embodiment described above may be implemented by the processes.

Further, software program code for implementing the functions of an embodiment may be delivered via a network and stored in a storage means, such as a hard disk or a memory of a system or device, or stored in a storage medium such as a CD-RW or a CD-R. In use, the program code may be read from the storage means or the storage medium and performed by a computer (or CPU or MPU) of the system or device.

The processes and techniques described herein are not in essence associated with any specific device. Various general-purpose devices may be used in accordance with the descriptions of the present disclosure. In some cases, it may be beneficial to construct a dedicated device for performing the techniques of the present disclosure.

Various embodiments may be formed by combining, as appropriate, a plurality of constituent elements disclosed herein. For example, some of the constituent elements disclosed in the present embodiment may be eliminated. Further, constituent elements from different embodiments may be combined, as appropriate. While the techniques of the present disclosure have been described with reference to a concrete embodiment, these are not intended as limiting the techniques of the present disclosure and are instead for illustrative purposes. It will be apparent to those skilled in the art that hardware, software, and firmware may be combined in a number of appropriate ways to implement the techniques of the present disclosure. For example, software described may be implemented using a wide variety of programs or script languages, such as assembler, C/C++, perl, Shell, PHP, Java (registered trademark), and the like.

Control lines and information lines that are illustrated with respect to the foregoing embodiment are those considered necessary for convenience of description, and do not necessarily represent all of control lines and information lines that are required in a product. All of the configurations may be interconnected.

What is claimed is:

1. An impedance matching device configured to be disposed between a power supply and a load and perform impedance matching between the power supply and the load, the impedance matching device comprising:

a first power supply configured to generate a first high-frequency voltage having a first fundamental frequency and supply a first high-frequency power to the load;

a detector configured to acquire information about the first high-frequency power;

an impedance information output part configured to calculate an impedance value based on the information acquired by the detector and to convert the calculated impedance value into a reflection coefficient having vector components; and a matching part configured to perform a matching operation in which an impedance matching between the power supply and the load, based on the vector components of the reflection coefficient supplied from the impedance information output part, wherein the impedance information output part generates an impedance locus using the impedance value.

2. The impedance matching device according to claim 1, wherein the detector is configured to detect a forward wave power supplied from the first power supply and a reflected wave power from the load and output a forward wave voltage as a component of the forward wave power and a reflected wave voltage as a component of the reflected wave power, and the impedance information output part is configured to (i) complexify each of the forward wave voltage and the reflected wave voltage, (ii) average each of the complexified forward wave voltage and the complexified reflected wave voltage during a fundamental period of the first power supply to generate an averaged complexified forward wave voltage and an averaged complexified reflected wave voltage, wherein the averaged complexified forward wave voltage includes first and second forward wave voltage components and wherein the averaged complexified reflected wave voltage includes first and second reflected wave voltage components, (iii) calculate the impedance value based on the first and second forward wave voltage components and the first and second reflected wave voltage components, and (iv) use, as the impedance locus, a locus represented by the vector components of the reflection coefficient corresponding to the impedance value.

3. The high-frequency power supply system for providing the high-frequency power to the load according to claim 2, comprising:

a second power supply configured to output a second high-frequency voltage having a second fundamental frequency that is lower than the first fundamental frequency.

4. The impedance matching device according to claim 2, wherein the forward wave power is under frequency control in the first power supply, and the impedance information output part calculates the impedance value using the forward wave voltage corresponding to the forward wave power that is under the frequency control, and the reflected wave voltage corresponding to the reflected wave power resulting from the forward wave power under the frequency control that is supplied to and then reflected back and returned from the load.

5. The high-frequency power supply system for providing the high-frequency power to the load according to claim 4, comprising:

a second power supply configured to output a second high-frequency voltage having a second fundamental frequency that is lower than the first fundamental frequency.

6. The impedance matching device according to claim 2, wherein when a second high-frequency power is supplied to the load using a second power supply that outputs a second high-frequency voltage having a second fundamental frequency that is lower than the first fundamental frequency, the impedance information output part uses, as the impedance locus, the locus represented by the vector components of the reflection coefficient during a time period corresponding to a fundamental period of the second high-frequency voltage.

7. The high-frequency power supply system for providing the high-frequency power to the load according to claim 6, comprising:

a second power supply configured to output a second high-frequency voltage having a second fundamental frequency that is lower than the first fundamental frequency.

8. The high-frequency power supply system for providing the high-frequency power to the load according to claim 1, comprising:

a second power supply configured to output a second high-frequency voltage having a second fundamental frequency that is lower than the first fundamental frequency.

* * * * *